(12) United States Patent
Yoshiya et al.

(10) Patent No.: US 12,020,931 B2
(45) Date of Patent: Jun. 25, 2024

(54) METHOD FOR FABRICATING FIELD-EFFECT TRANSISTOR (71) Applicant: Nippon Telegraph and Telephone Corporation, Tokyo (JP)

(72) Inventors: Yuki Yoshiya, Tokyo (JP); Takuya Hoshi, Tokyo (JP); Hiroki Sugiyama, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 445 days.

(21) Appl. No.: 17/423,401

(22) PCT Filed: Jan. 8, 2020

(86) PCT No.: PCT/JP2020/000250
§ 371 (c)(1),
(2) Date: Jul. 15, 2021

(87) PCT Pub. No.: WO2020/149186
PCT Pub. Date: Jul. 23, 2020

(65) Prior Publication Data
US 2022/0051889 A1 Feb. 17, 2022

(30) Foreign Application Priority Data

Jan. 18, 2019 (JP) .................................. 2019-006681

(51) Int. Cl.
*H01L 21/02* (2006.01)

(52) U.S. Cl.
CPC .... *H01L 21/0254* (2013.01); *H01L 21/02271* (2013.01); *H01L 21/02378* (2013.01);
(Continued)

(58) Field of Classification Search
CPC .......... H01L 21/0254; H01L 21/02458; H01L 21/02; H01L 21/302; H01L 21/6835;
(Continued)

(56) References Cited

U.S. PATENT DOCUMENTS

2009/0072272 A1* 3/2009 Suh ...................... H01L 29/778
257/E21.409
2009/0085065 A1* 4/2009 Mishra .............. H01L 29/66462
438/455
(Continued)

FOREIGN PATENT DOCUMENTS

JP 4984407 B2 * 7/2012 ........... H01L 21/338

OTHER PUBLICATIONS

Arita, Munetaka & Kako, Satoshi & Iwamoto, Satoshi & Arakawa, Yasuhiko. (2012). Fabrication of AlGaN Two-Dimensional Photonic Crystal Nanocavities by Selective Thermal Decomposition of GaN. Applied Physics Express. 5.126502 (Year: 2012).*
(Continued)

*Primary Examiner* — Alia Sabur
(74) *Attorney, Agent, or Firm* — SLATER MATSIL, LLP (57) ABSTRACT

A first semiconductor layer, a second semiconductor layer, a channel layer, a barrier layer, and a third semiconductor layer are crystal-grown in this order on a first substrate in the +c axis direction, a second substrate is bonded to the side of the barrier layer of the first substrate, and after that, the first substrate is removed, and the first semiconductor layer is selectively thermally decomposed by heating.

10 Claims, 2 Drawing Sheets

(52) U.S. Cl.
CPC .. *H01L 21/02458* (2013.01); *H01L 21/02516* (2013.01); *H01L 21/02609* (2013.01)

(58) Field of Classification Search
CPC ........... H01L 29/2003; H01L 29/66462; H01L 29/7783; H01L 2221/6835; H01L 2221/68363; H01L 2221/68381; H01L 2221/68368; H01L 2924/66431; H01L 2924/13604; H01L 29/66431; H01L 29/778; H01L 29/7781; H01L 29/7786
See application file for complete search history.

(56) References Cited

U.S. PATENT DOCUMENTS

| | | | | |
|---|---|---|---|---|
| 2009/0146185 | A1* | 6/2009 | Suh | H01L 29/42364 257/E27.061 |
| 2009/0267188 | A1* | 10/2009 | Piner | H01L 29/66462 438/45 |
| 2015/0084104 | A1* | 3/2015 | Ando | H01L 29/2003 257/288 |
| 2017/0301772 | A1* | 10/2017 | Radway | H01L 21/6835 |
| 2017/0365667 | A1* | 12/2017 | Sato | H01L 29/205 |
| 2018/0182689 | A1* | 6/2018 | Okuno | H01L 21/764 |

OTHER PUBLICATIONS

K. K. Ryu, J. C. Roberts, E. L. Piner and T. Palacios, "Thin-Body N-Face GaN Transistor Fabricated by Direct Wafer Bonding," in IEEE Electron Device Letters, vol. 32, No. 7, pp. 895-897, Jul. 2011, doi: 10.1109/LED.2011.2147751 (Year: 2011).*

Yoshiya, Yuki, Hoshi, Takuya, Sugiyama, Hiroki, & Matsuzaki, Hideaki (2021). Impact of selective thermal etching in mixed H2/NH3 atmosphere on crystal quality of AlGaN/GaN heterostructures. Japanese Journal of Applied Physics (Online), 60(SB), SBBK111-SBBK116 (Year: 2021).*

Chung, J. W. et al., "N-Face GaN/AlGaN HEMTs Fabricated Through Layer Transfer Technology," IEEE Electron Device Letters, vol. 30, No. 2, Feb. 2009, 4 pages.

Keller, S. et al., "Influence of the Substrate Misorientation on the Properties of N-polar InGaN/GaN and AlGaN/GaN Heterostructures," Journal of Applied Physics, vol. 104, No. 9, Nov. 5, 2008, 7 pages.

Ryu, K. K. et al., "Thin-Body N-Face GaN Transistor Fabricated by Direct Wafer Bonding," IEEE Electron Device Letters, vol. 32, No. 7, Jul. 2011, 3 pages.

Sumiya, M. et al., "Growth Mode and Surface Morphology of a GaN Film Deposited Along the N-face Polar Direction on c-plane Sapphire Substrate," Journal of Applied Physics, vol. 88, No. 2, Jul. 15, 2000, 9 pages.

Takagi, H. et al., "Surface Activated Bonding of Silicon Wafers at Room Temperature," Applied Physics Letters, vol. 68, No. 16, Apr. 15, 1996, 4 pages.

Wong, M. H. et al., "N-polar GaN Epitaxy and High Electron Mobility Transistors," Semiconductor Science and Technology, vol. 28, No. 7, Jun. 21, 2013, 23 pages.

* cited by examiner

Fig. 1F

# METHOD FOR FABRICATING FIELD-EFFECT TRANSISTOR

CROSS-REFERENCE TO RELATED APPLICATIONS

This patent application is a national phase filing under section 371 of PCT/JP2020/000250, filed Jan. 8, 2020, which claims the priority of Japanese patent application no. 2019-006681, filed Jan. 18, 2019, each of which is incorporated herein by reference in its entirety.

TECHNICAL FIELD

The present invention relates to a method for producing a field effect transistor using a nitride semiconductor.

BACKGROUND

A field effect transistor using a nitride semiconductor such as GaN having a large bandgap and a high dielectric breakdown electric field strength exhibits high withstand voltage characteristics. Since the nitride semiconductor has polarization in the c-axis direction, it is possible to spontaneously form a sheet carrier (two-dimensional electron gas) in the vicinity of the bonding interface by forming a heterojunction. A GaN-based heterojunction field effect transistor (HFET) or a high electron mobility transistor (HEMT) produced by utilizing these characteristics have generally been made with the main plane orientation as the Ga polar (Group III polar) plane.

A HFET or HEMT is a transistor that turns on/off by changing the carrier density of a channel by an electric field generated by a gate voltage. When this transistor includes a nitride semiconductor, for example, an AlGaN/GaN heterostructure is used. In this heterostructure, a two-dimensional electron gas (2 DEG) formed by gathering electrons at the interface so as to compensate for the difference in the magnitude of polarization between AlGaN and GaN is often used as a channel. In general HEMT using Ga-polar GaN, a gate electrode is formed on an AlGaN layer of about several nm to several tens of nm to control the 2 DEG concentration at the AlGaN/GaN interface.

HEMTs using nitride semiconductors as described above are being applied to high-frequency devices that take advantage of the high mobility of 2 DEG. However, in the Ga-polar HEMT, since the barrier layer made of AlGaN having a large band gap is disposed on the surface side of the device, the first problem is that the contact resistance is high. In addition, in the HEMT with Ga polarity, there is a second problem in which the barrier layer cannot be made thinner in order to maintain the carrier density, leading to short channel effects. These problems hinder the improvement of high frequency characteristics of HEMT by the nitride semiconductor.

In order to reduce the contact resistance, which is one of the above-described problems, a technique for regrowth of the region directly under the source/drain electrode is being studied. In addition, in order to suppress the short-channel effect, which is one of the above-described problems, techniques such as forming a barrier layer from AlGaN having an enhanced Al composition to make the barrier layer thinner are being studied. However, these techniques have limitations in reducing contact resistance.

On the other hand, N-polar GaN crystal-grown with the N-polar (group V-polar) plane as the main plane orientation is a crystal obtained by inverting Ga-polar GaN, and has the following three advantages when producing HEMT. First, in order to supply carriers, a barrier layer made of AlGaN, which requires a high Al composition and a film thickness of about 20 nm and has high resistance, is disposed below a channel layer made of GaN. Therefore, in the above configuration, the barrier layer is not disposed between the electrode and the channel, so that the contact resistance can be lowered.

Second, since the thickness of the channel layer disposed on the side of the electrode does not significantly affect the carrier density, the channel layer can be thinner to inhibit the short channel effect.

Third, the barrier layer directly below the channel layer serves as a back barrier, and the short-channel effect can be suppressed.

From the above-described advantages, by producing a HEMT (N-polar HEMT) using a layer of a nitride semiconductor (N-polar nitride semiconductor) crystal-grown with the N-polar plane as the main plane orientation, further improvement of high frequency characteristics of HEMT can be expected (see Non Patent Literature 1).

CITATION LIST

Non Patent Literature

Non Patent Literature 1: M. H. Wong et al., "N-polar GaN epitaxy and high electron mobility transistors", Semiconductor Science and Technology, vol. 28, 074009, 2013.
Non Patent Literature 2: M. Sumiya et al., "Growth mode and surface morphology of a GaN film deposited along the N-face polar direction on c-plane sapphire substrate", Journal of Applied Physics, vol. 88, no. 2, pp. 1158-1165, 2000.
Non Patent Literature 3: S. Keller et al., "Influence of the substrate misorientation on the properties of N-polar InGaN/GaN and AlGaN/GaN heterostructures", Journal of Applied Physics, vol. 104, no. 9, 093510, 2008.
Non Patent Literature 4: J. W. Chung et al., "N-Face GaN/AlGaN HEMTs Fabricated Through Layer Transfer Technology", IEEE Electron Device Letters, vol. 30, no. 2, pp. 113-116, 2009.
Non Patent Literature 5: K. K. Ryu et al., "Thin-Body N-Face GaN Transistor Fabricated by Direct Wafer Bonding", IEEE Electron Device Letters, vol. 32, no. 7, pp. 895-897, 2011.
Non Patent Literature 6: H. Takagi et al., "Surface activated bonding of silicon wafers at room temperature", Applied Physics Letters, vol. 68, no. 16, pp. 2222-2224, 1996.

SUMMARY

Technical Problem

As described above, it is known that the high frequency characteristics of HEMT can be expected to be improved by using the N-polar nitride semiconductor, but the N-polar nitride semiconductor has a problem in crystal growth.

For example, it is known that GaN grown with N polarity has problems such as lower flatness and higher dislocation density than GaN grown with Ga polarity (see Non Patent Literature 2). In some cases, transistors were produced by growing crystals on a substrate with a large off-angle to solve the above problems to some extent. However, it is known that the sheet resistance differs depending on the relationship between the off-angle direction and the direction of the current flowing through the channel (see Non Patent Literature 3), so that the above example imposes restrictions on device production.

As a technique for avoiding the problem of crystal growth of N-polar nitride semiconductors, a technique is being studied in which a nitride semiconductor layer grown with Ga polarity is inverted and bonded to another substrate, and a device is produced with a nitride semiconductor layer having an N-polar surface on the side away from the substrate (see Non Patent Literature 4). In this technique, since the layer of the nitride semiconductor that constitutes the device is grown with Ga polarity, crystal qualities such as dislocation density and mobility anisotropy can be expected to be equivalent to Ga polar transistors in the related art.

On the other hand, in this technique, the process of peeling the growth substrate and removing the buffer layer to obtain the device surface has a great influence on the device characteristics. In order to bring out the characteristics of N-polar HEMT, it is necessary to make the channel layer thin and to obtain a flat surface in order to suppress scattering. For this purpose, it is necessary to proceed with the etching of the buffer layer with good controllability. In Non Patent Literature 5, the buffer layer is etched by dry etching with inductive coupled plasma (ICP). In dry etching by ICP, it is known that selecting an etching gas allows etching of GaN with AlGaN as the etch stop layer, which achieves N-polar HEMT with a channel layer thickness of 20 nm.

However, in order to improve the high frequency characteristics of transistors, further thinning is required. In etching using ICP, the ratio of the etching rates of AlGaN and GaN is limited to about several tens, and it is difficult to control the thickness of the channel layer with high accuracy and thin the layer. Further, there are problems in which the use of plasma damages the crystal surface and causes crystal defects, making it impossible to improve high-frequency characteristics.

Embodiments of the present invention have been made to solve the above problems, and an object of the present invention is to further improve high frequency characteristics of a field effect transistor including a nitride semiconductor formed with the main plane orientation set to N polarity.

Means for Solving the Problem

The method for producing a field effect transistor according to embodiments of the present invention includes: (i) crystal-growing a first semiconductor layer comprising GaN, a second semiconductor layer comprising a nitride semiconductor containing Al and having a higher thermal decomposition temperature than GaN, a channel layer comprising a nitride semiconductor, and a barrier layer comprising a nitride semiconductor having bandgap energy larger than that of the channel layer in the +c axis direction in this order on a first substrate; (ii) bonding a second substrate to the barrier layer side of the first substrate; (iii) removing the first substrate and creating a state in which the barrier layer, the channel layer, the second semiconductor layer, and the first semiconductor layer are formed in this order on the second substrate; (iv) after removing the first substrate, then selectively thermally decomposing the first semiconductor layer by heating in a hydrogen atmosphere containing ammonia to remove the first semiconductor layer and expose the second semiconductor layer; (v) forming a source electrode that is in ohmic connection with the channel layer and a drain electrode that is in ohmic connection with the channel layer; and (vi) forming a gate electrode between the source electrode and the drain electrode.

In one configuration example of the method for producing a field effect transistor, in the step (i), a third semiconductor layer comprising a nitride semiconductor is formed on the barrier layer by crystal growth in the +c axis direction, and, in the step (ii), the second substrate is bonded by bonding the second substrate to the third semiconductor layer.

In one configuration example of the method for producing the field effect transistor, the first semiconductor layer comprises GaN and has a layer thickness of 200 nm or more, the channel layer comprises GaN, the barrier layer comprises AlN or AlGaN, the third semiconductor layer comprises GaN and has a layer thickness of 100 nm or more, and, in the step (i), the first semiconductor layer is formed in contact with the first substrate, the second semiconductor layer is formed in contact with the first semiconductor layer, the channel layer is formed in contact with the second semiconductor layer, the barrier layer is formed in contact with the channel layer, and the third semiconductor layer is formed in contact with the barrier layer.

In one configuration example of the method for producing the field effect transistor, in the step (v), after removing the second semiconductor layer, the source electrode and the drain electrode are formed, and in the step (vi), after removing the second semiconductor layer, the gate electrode is formed on the channel layer.

In one configuration example of the method for producing the field effect transistor, the second semiconductor layer comprises Al having a composition of 20% or less and has a layer thickness of 20 nm or less, and, in the step (iv), the first semiconductor layer is selectively thermally decomposed by heating at a temperature condition of 1000 to 1200° C. in a hydrogen atmosphere containing ammonia having a molar flow ratio of 1% or less to remove the first semiconductor layer and expose the second semiconductor layer.

Effects of Embodiments of the Invention

As described above, according to embodiments of the present invention, the main surface orientation is set to N polarity by substrate transfer by bonding, and the first semiconductor layer is removed by utilizing the etching selection ratio between the first semiconductor layer including GaN and the second semiconductor layer including a nitride semiconductor containing Al and having a higher thermal decomposition temperature than GaN by thermal decomposition, so that the field effect transistor including a nitride semiconductor formed with the main plane orientation as N polarity can further improve the high frequency characteristics.

DETAILED DESCRIPTION OF ILLUSTRATIVE EMBODIMENTS

Hereinafter, a method for producing the field effect transistor according to an embodiment of the present invention will be described with reference to FIGS. 1A to 1F.

Figure 1A:
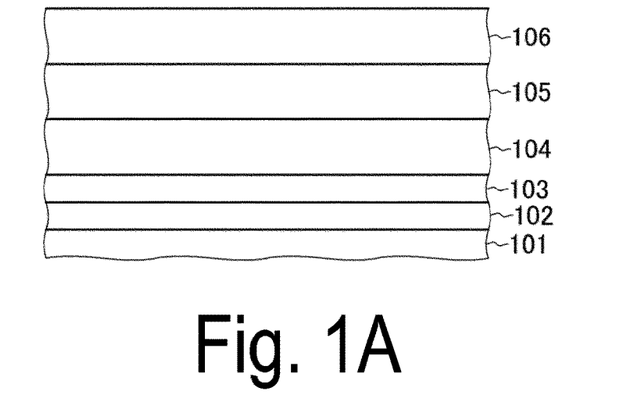
FIG. 1A is a cross-sectional view illustrating a state of each layer in an intermediate process for describing a method for producing a field effect transistor according to an embodiment of the present invention.

First, as shown in FIG. 1A, a first semiconductor layer 102, a second semiconductor layer 103, a channel layer 104, a barrier layer 105, and a third semiconductor layer 106 are placed on a first substrate 101 and are crystal-grown in this order on the +c axis (step (i)). The first semiconductor layer 102 is formed in contact with the first substrate 101, the second semiconductor layer 103 is formed in contact with the first semiconductor layer 102, the channel layer 104 is in contact with the second semiconductor layer 103, the barrier layer 105 is formed in contact with the channel layer 104, and the third semiconductor layer 106 is formed in contact with the barrier layer 105. By crystal growth in the +c axis direction, each of the above-described nitride semiconductor layers grows with the main plane orientation as the Ga polar plane.

The first substrate 101 includes, for example, sapphire ($Al_2O_3$), and for example, the plane orientation of the main surface is (0001). The first substrate 101 may include not only sapphire, but also Si, SiC, GaN and the like. As will be described later, the first substrate 101 is preferably, for example, Si, the substrate of which can be removed by dry etching, or sapphire to which known peeling techniques such as laser lift-off can be applied. However, the present invention will not be limited to these.

The first semiconductor layer 102 includes GaN. For example, a nucleation layer including GaN is formed on the first substrate 101 including sapphire by a well-known metalorganic vapor phase growth method, molecular beam epitaxy method, or the like under lower temperature conditions. Subsequently, the first semiconductor layer 102 can be formed by growing GaN under higher temperature conditions. As is well known, the nucleation layer is a layer configured to support the nucleation of the initial growth to obtain a high quality and flat crystal in order to grow the crystal of a nitride semiconductor such as GaN on different kinds of substrates of sapphire, Si, SiC, and the like. The nucleation layer has various nomenclature such as a low temperature buffer layer and a low temperature buffer.

By adjusting the nucleation layer, the surface of the nucleation layer is made a Ga polar surface. By making the surface of the nucleation layer a Ga polar surface, the nitride semiconductor crystal grows in the +c axis direction on the Ga polar surface of the nucleation layer. The nucleation layer is not limited to GaN, and may also be constituted of other nitride materials such as AlN and AlON. When the first substrate 101 includes GaN, the nucleation layer may not be necessary.

Here, it is desirable that the first semiconductor layer 102 is formed in consideration of the following points. The GaN grown on the first substrate 101 including sapphire using the nucleation layer becomes a layer with many defects from the interface with the first substrate 101 to about 200 nm, and the defect density decreases as the layer thickness increases. From this, it is desirable that the first semiconductor layer 102 is formed to have a thickness of about 200 nm or more including the nucleation layer.

Further, the first semiconductor layer 102 may be partially removed together with the first substrate 101 when the first substrate 101 is removed as described later. Further, the first semiconductor layer 102 is a layer that can serve as a buffer layer for a surface flattening step such as polishing after removing the first substrate 101. Techniques such as back grinding, dry etching, and laser lift-off may be applied to remove the first substrate 101. However, a surface roughness having an arithmetic average roughness Ra of about several nm generally occurs on the surface of the first semiconductor layer 102 after the removal. In order to flatten the surface of the first semiconductor layer 102 so that Ra is 1 nm or less, it is desirable to scrape the first semiconductor layer 102 by about 100 nm or more by chemical mechanical polishing.

When the thickness of the first semiconductor layer 102 is about 200 nm or more, it is sufficient as a buffer layer for the above-described processing steps such as polishing for surface flattening. Depending on the substrate, AlN or a multilayer film may be used as a buffer, but the important point here is that the outermost surface of the Ga polar surface of the buffer layer is GaN.

The second semiconductor layer 103 includes a nitride semiconductor containing Al and having a higher thermal decomposition temperature than GaN. The second semiconductor layer 103 may include, for example, AlN or AlGaN. The second semiconductor layer 103 can be formed by epitaxially growing AlN or AlGaN on the first semiconductor layer 102 by an organic metal vapor phase growth method, a molecular beam epitaxy method, or the like. The second semiconductor layer 103 is introduced for the purpose of stopping etching when removing the first semiconductor layer 102 and exposing the device. In the thermal decomposition used for etching the first semiconductor layer 102, which will be described later, it is desirable to use AlGaN or AlN, which has a higher thermal decomposition temperature than the GaN to be etched, for the second semiconductor layer 103. Further, for the reason described later, the second semiconductor layer 103 including AlGaN has an Al composition of 7% and a thickness of 10 nm.

The channel layer 104 includes, for example, a nitride semiconductor such as GaN. The channel layer 104 can be formed by epitaxially growing GaN on the second semiconductor layer 103 by an organic metal vapor phase growth method, a molecular beam epitaxy method, or the like.

The barrier layer 105 includes a nitride semiconductor having a bandgap energy larger than that of the channel layer 104. The barrier layer 105 may include, for example, AlN or $Al_{0.25}Ga_{0.75}N$. The barrier layer 105 may be formed by epitaxially growing AlN or AlGaN on the channel layer 104 by an organic metal vapor phase growth method, a molecular beam epitaxy method, or the like.

The channel layer 104 and the barrier layer 105 are layers constituting a field effect transistor (HEMT). In the embodiment, as will be described later, the channel layer 104 and the barrier layer 105 having grown to be Ga polar are inverted to produce an N-polar HEMT in which the channel layer 104 is disposed on the barrier layer 105. The N-polar HEMT is a field effect transistor in which the channel layer 104 is formed on the barrier layer 105 with the N-polar plane facing up, and two-dimensional electron gas (2 DEG) generated from the polarization difference between them is used as a channel.

The Al composition and layer thickness of the barrier layer 105 and the layer thickness of the channel layer 104 may be set to values generally used in HEMT. For example, the channel layer 104 is grown to have a thickness of about 200 nm on the second semiconductor layer 103 grown with Ga polarity. Subsequently, the barrier layer 105 is grown on the channel layer 104 to have an Al composition of about 25% and a thickness of about 20 nm.

The third semiconductor layer 106 includes a nitride semiconductor such as GaN. In the substrate bonding described later, the surface to be bonded is polished in order to obtain the flatness required for the bonding. Therefore, it is desirable to form the third semiconductor layer 106 having a sufficient thickness on the barrier layer 105 in consideration of the thickness reduced by polishing.

For example, in direct bonding, the bonded surface is generally required to have a flatness with an arithmetic mean roughness Ra of about 0.5 nm or less. On the other hand, the surface of the layer of the nitride semiconductor crystal grown heteroepitaxially on a dissimilar substrate shows a surface roughness of about several nm in arithmetic average roughness Ra. In order to flatten such a surface to about 0.5 nm in Ra, for example, the third semiconductor layer 106 is scraped off a thickness of about 100 nm by using a technique of chemical mechanical polishing. Therefore, it is desirable that the thickness of the third semiconductor layer 106 is 100 nm or more in consideration of the thickness reduced by polishing.

After flattening the surface of the third semiconductor layer 106 as described above, as illustrated in FIG. 1B, a second substrate 121 is attached to the side of the barrier layer 105 of the first substrate 101 (step (ii)). In the embodiment, the second substrate 121 is bonded to the third semiconductor layer 106 such that the second substrate 121 is attached to the barrier layer 105 side of the first substrate 101. The bonding between the third semiconductor layer 106 and the second substrate 121 may use known bonding techniques such as room temperature bonding and surface activation bonding (SAB) (see Non Patent Literature 6).

Figure 1B:
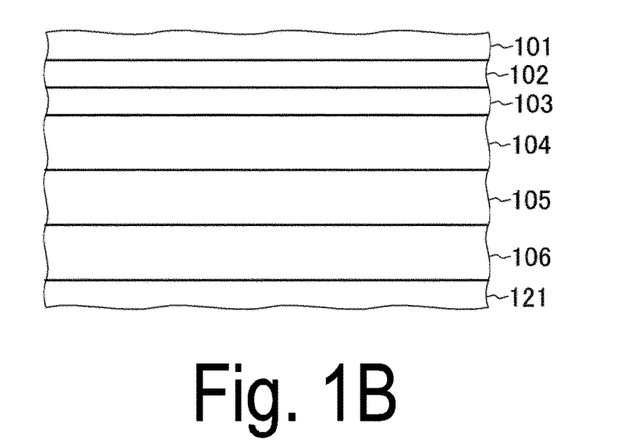
FIG. 1B is a cross-sectional view illustrating a state of each layer in an intermediate process for describing a method for producing a field effect transistor according to an embodiment of the present invention.

The second substrate 121 includes, for example, silicon carbide (SiC). The second substrate 121 is required to have surface flatness according to the bonding technique in bonding with the third semiconductor layer 106, but there is no limitation on the material. The second substrate 121 is not limited to SiC, but may include Si, sapphire, or the like. Further, a substrate obtained by crystal-growth of a predetermined semiconductor on a SiC substrate, a Si substrate, or a sapphire substrate may be used as the second substrate 121. Further, the surface of the second substrate 121 may be flattened by chemical mechanical polishing in order to obtain flatness with Ra of about 0.5 nm.

Figure 1C:
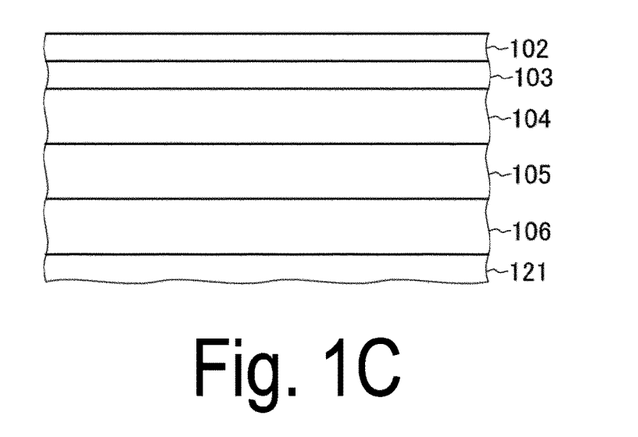
FIG. 1C is a cross-sectional view illustrating a state of each layer in an intermediate process for explaining a method for producing a field effect transistor according to an embodiment of the present invention.

Next, as illustrated in FIG. 1C, the first substrate 101 is removed, and the third semiconductor layer 106, the barrier layer 105, the channel layer 104, the second semiconductor layer 103, and the first semiconductor layer 102 are formed in this order on the second substrate 121 (step (iii)). A known technique may be used for removing the first substrate 101. For example, the first substrate 101 is scraped and thinned by back grinding, and the remaining first substrate 101 is ground by chemical mechanical polishing to expose and flatten the surface of the first semiconductor layer 102. The surface of the first semiconductor layer 102 exposed in this way is an N-polar surface. Further, by flattening the exposed surface of the first semiconductor layer 102 as described above, it becomes easy to obtain the surface flatness of the first semiconductor layer 102 after etching removal in the subsequent step.

Figure 1D:
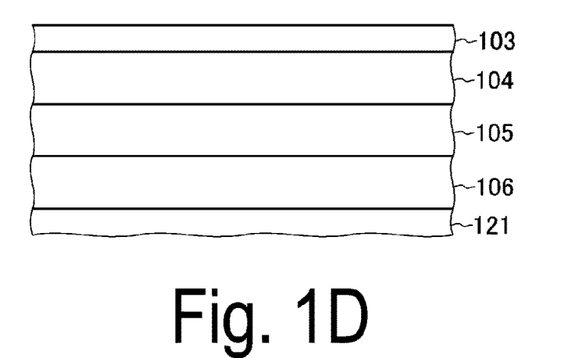
FIG. 1D is a cross-sectional view illustrating a state of each layer in an intermediate process for explaining a method for producing a field effect transistor according to an embodiment of the present invention.

After removing the first substrate 101 as described above, the first semiconductor layer 102 is removed by selectively thermally decomposing the first semiconductor layer 102 by heating in a hydrogen atmosphere containing ammonia, and, as illustrated in FIG. 1D, the second semiconductor layer 103 is exposed (step (v)).

For example, after removing the first substrate 101, the second substrate 121 on which the third semiconductor layer 106, the barrier layer 105, the channel layer 104, the second semiconductor layer 103, and the first semiconductor layer 102 are laminated is carried into a predetermined heating furnace, the inside of the furnace is made into a hydrogen atmosphere to which ammonia is added, and is maintained at a high temperature (for example, from 1000 to 1200° C.), thereby thermally decomposing the GaN constituting the first semiconductor layer 102. Since AlGaN and AlN containing Al have a higher thermal decomposition temperature than GaN, the etching by thermal decomposition described above causes a difference in etching rate between GaN and AlGaN or AlN. Due to this difference in etching rate, the second semiconductor layer 103 including AlGaN or AlN can be used as the etching stop layer.

The etching selection ratio between the second semiconductor layer 103 including AlGaN or AlN and the first semiconductor layer 102 including GaN changes according to the Al composition of the second semiconductor layer 103, the temperature in the furnace, and the molar flow ratio of ammonia. For example, under the condition where the temperature of the substrate surface is about 1050° C. and the molar flow rate of ammonia supplied in the furnace is about 1% of the total flow rate, the etching rate of GaN is about 10 nm/min, and if AlGaN having an Al composition of about 7% is used, the etching selection ratio with GaN can be set to 100 or more. Therefore, the second semiconductor layer 103 including AlGaN having an Al composition of 7% sufficiently functions as an etching stop layer by the etching process by thermal decomposition of the first semiconductor layer 102 including GaN.

Here, as described above, the first semiconductor layer 102 is thinned by flattening due to the removal of the first substrate 101. For example, the first semiconductor layer 102 grown to a thickness of about 200 nm is considered to be cut off a thickness of about 100 nm by flattening to a thickness of about 100 nm. Under the above-described etching treatment conditions by thermal decomposition, it takes about 10 minutes to remove the first semiconductor layer 102 having a thickness of 100 nm by etching. On the other hand, under the above-described etching treatment conditions by thermal decomposition, it takes 100 minutes to etch the second semiconductor layer 103 by a thickness of about 10 nm. Therefore, according to the etching treatment conditions by thermal decomposition described above, the first semiconductor layer 102 can be selectively removed with a sufficient selection ratio to the second semiconductor layer 103.

In the etching process by thermal decomposition described above, the first semiconductor layer 102 containing many defects is selectively removed because it is grown in contact with the first substrate 101.

Figure 1E:
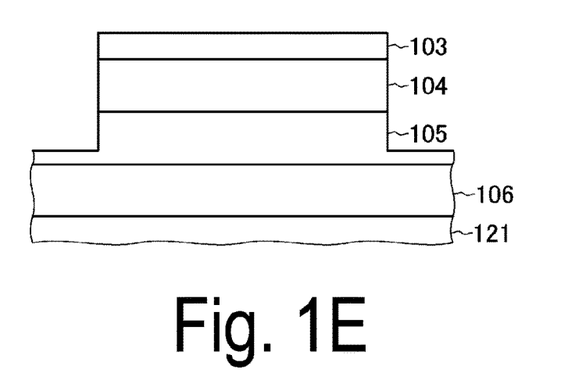
FIG. 1E is a cross-sectional view illustrating a state of each layer in an intermediate process for explaining a method for producing a field effect transistor according to an embodiment of the present invention.

Next, the barrier layer 105, the channel layer 104, and the second semiconductor layer 103 are patterned by a known photolithography technique and etching technique to form a mesa and perform inter-element separation as illustrated in FIG. 1E. The mesa is a rectangular shape in a plan view. As an etching technique for forming this mesa, a known technique such as ICP-reactive ion etching (RIE) may be used. For separation between elements, a mesa is formed halfway through the barrier layer 105 in the thickness direction. The field effect transistor produced by the production method of the embodiment uses 2 DEG formed at the interface between the channel layer 104 and the barrier layer 105 as a channel carrier. Therefore, it is desirable to form the mesa deeper in the thickness direction than the position where the 2 DEG is formed.

Figure 1F:
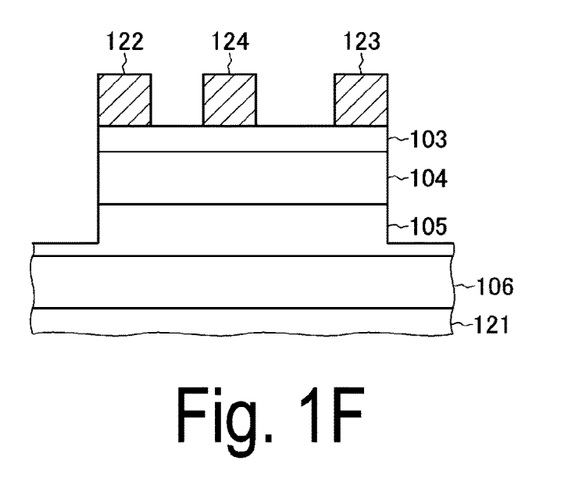
FIG. 1F is a cross-sectional view illustrating a configuration of a field effect transistor produced by the method for producing a field effect transistor according to an embodiment of the present invention.

Next, as illustrated in FIG. 1F, a source electrode 122 that is in ohmic connection with the channel layer 104 and a drain electrode 123 that is in ohmic connection with the channel layer 104 are formed (step (v)). Further, a gate electrode 124 is formed on the channel layer 104 between the source electrode 122 and the drain electrode 123 (step (vi)). From these things, for example, HEMT is formed.

The source electrode 122 and the drain electrode 123 have a laminated structure of metals having a known combination such as Ti/Al/Ni/Au. The gate electrode 124 has a laminated structure of metals of a known combination such as Ti/Au.

In the embodiment, metal layers to be the source electrode 122 and the drain electrode 123 are formed on the second semiconductor layer 103, and then ohmic connection is made by heat treatment. The second semiconductor layer 103 has a low Al composition of 7% and a thin thickness of 10 nm. Therefore, even if the source electrode 122 and the drain electrode 123 are formed on the second semiconductor layer 103, the increase in resistance due to the second semiconductor layer 103 can be suppressed and made in ohmic connection with the channel layer 104. Alternatively, the second semiconductor layer 103 may be used as the gate insulating layer by forming the gate electrode 124 after forming the source electrode 122 and the drain electrode 123 and not performing the heat treatment after forming the gate electrode 124. The gate electrode 124 may also be formed by connecting with a shot key.

In the above-described embodiment, the barrier layer 105 is formed to have an Al composition of about 25% and a thickness of about 20 nm, and the channel layer 104 includes GaN, but the present invention is not limited to this embodiment. For example, the barrier layer 105 may include AlGaN having a higher Al composition, and have a thinner thickness. The composition of Al in the barrier layer 105 may be changed in the thickness direction to form a composition gradient structure. In addition, the channel layer 104 may be made thinner. The channel layer 104 may include a plurality of layers such as a composite channel structure, or may include a mixed crystal such as InGaN.

Further, in the embodiment, HEMT has been described as an example, but the present invention is not limited to this, and the same applies to, for example, HFET.

Further, the second semiconductor layer 103 includes AlGaN having an Al composition of 7% and has a thickness of 10 nm, but the present invention is not limited to these conditions. When the source electrode 122 and the drain electrode 123 are formed on the second semiconductor layer 103, the effect of reducing contact resistance can be obtained by lowering the Al composition of the second semiconductor layer 103 than the Al composition of the general barrier layer including AlGaN, or by making the second semiconductor layer 103 thinner than the general barrier layer including AlGaN. For example, the second semiconductor layer 103 may include a nitride semiconductor containing Al having a composition of 20% or less, and have a thickness of 20 nm or less.

Alternatively, the second semiconductor layer 103 may be removed, and the source electrode 122 and the drain electrode 123 may be formed on the channel layer 104. With such a configuration, the source electrode 122 and the drain electrode 123 can be contacted with the channel layer 104 without going through the second semiconductor layer 103, so that further reduction in contact resistance can be expected. In this case, after forming the source electrode 122 and the drain electrode 123, a gate insulating layer is formed on the channel layer 104, and the gate electrode 124 is formed on the gate insulating layer.

Further, the Al composition of the second semiconductor layer 103 may be made higher to lower the etching rate, and, for example, the second semiconductor layer 103 may be made of AlN, thereby further increasing the selection ratio in etching removal of the first semiconductor layer 102.

Further, in the above-described embodiment, the first semiconductor layer 102 is removed by etching by one step of selective thermal decomposition using a set of the first semiconductor layer 102 and the second semiconductor layer 103, but the present invention is not limited thereto. Using a plurality of sets of the first semiconductor layer and the second semiconductor layer, each first semiconductor layer may be removed by etching by multiple steps of selective thermal decomposition, thereby leaving one second semiconductor layer on the channel layer 104 side. In this case, the Al composition and thickness of each of the plurality of second semiconductor layers may be different.

In the above-described embodiment, after the second semiconductor layer 103 is exposed, an electrode metal layer is formed and additionally heated to form an ohmic connection with the source electrode 122, the drain electrode 123, and the channel layer 104. However, the invention is not limited to this embodiment. In the embodiment, the Al composition of the second semiconductor layer 103 is as low as 7% with respect to 25% of the general barrier layer. Further, in the embodiment, the thickness of the second semiconductor layer 103 is set to 10 nm, which is thinner than 20 nm, which is the thickness of the general barrier layer. From this, it is possible to achieve a contact resistance lower than that of the related-art Ga polar HEMT, but the contact resistance may be reduced by forming a highly doped semiconductor region by ion implantation, regrowth, or the like under the source electrode 122 and the drain electrode 123 (on the substrate side).

Further, in the above-described embodiment, each electrode is formed on the N-polar surface side of the channel layer 104, but the present invention is not limited to this embodiment. For example, by forming the second substrate 121 from a conductive material, the second substrate 121 can be used as a gate electrode.

As described above, according to embodiments of the present invention, the field effect transistor including a nitride semiconductor formed with the main surface orientation as N polarity can further improve the high frequency characteristics, because the main surface orientation is set to N polarity by transferring the substrate by bonding, and the first semiconductor layer is removed by utilizing the etching selection ratio between the first semiconductor layer including GaN and the second semiconductor layer including a nitride semiconductor containing Al and having a higher thermal decomposition temperature than GaN by thermal decomposition.

The present invention is not limited to the embodiments described above, and it is obvious that many modifications and combinations can be implemented by a person having ordinary knowledge in the field within the technical spirit of the present invention.

REFERENCE SIGNS LIST

101 First substrate
102 First semiconductor layer
103 Second semiconductor layer
104 Channel layer
105 Barrier layer
106 Third semiconductor layer
121 Second substrate
122 Source electrode
123 Drain electrode
124 Gate electrode

The invention claimed is:

1. A method for producing a field effect transistor, the method comprising:
   (i) crystal-growing a first semiconductor layer comprising GaN, a second semiconductor layer comprising a nitride semiconductor containing Al and having a higher thermal decomposition temperature than GaN, a channel layer comprising a nitride semiconductor, and a barrier layer comprising a nitride semiconductor having bandgap energy larger than that of the channel layer in a first axis direction in this order on a first side of a first substrate;
   (ii) bonding a second substrate on the first side of the first substrate;
   (iii) removing the first substrate and creating a state in which the barrier layer, the channel layer, the second semiconductor layer, and the first semiconductor layer are formed in this order on the second substrate;
   (iv) after removing the first substrate, selectively thermally decomposing the first semiconductor layer by heating in a hydrogen atmosphere containing ammonia to remove the first semiconductor layer and expose the second semiconductor layer;
   (v) forming a source electrode on the second semiconductor layer and in ohmic connection with the channel layer and a drain electrode on the second semiconductor layer and in ohmic connection with the channel layer; and
   (vi) forming a gate electrode between the source electrode and the drain electrode.

2. The method according to claim 1, wherein:
   in the step (i), a third semiconductor layer comprising a nitride semiconductor is formed on the barrier layer by crystal growth in the first axis direction; and
   in the step (ii), the second substrate is bonded by bonding the second substrate to the third semiconductor layer.

3. The method according to claim 2, wherein
   the first semiconductor layer has a layer thickness of 200 nm or more;
   the channel layer comprises GaN;
   the barrier layer comprises AlN or AlGaN;
   the third semiconductor layer comprises GaN and has a layer thickness of 100 nm or more; and
   in the step (i), the first semiconductor layer is formed in contact with the first substrate, the second semiconductor layer is formed in contact with the first semiconductor layer, the channel layer is formed in contact with the second semiconductor layer, the barrier layer is formed in contact with the channel layer, and the third semiconductor layer is formed in contact with the barrier layer.

4. The method according to claim 1, wherein:
   in the step (v), the source electrode and the drain electrode are formed after removing the first semiconductor layer; and
   in the step (vi), the gate electrode is formed on the channel layer after removing the first semiconductor layer.

5. The method according to claim 1, wherein:
   the second semiconductor layer comprises Al having a composition of 20% or less and has a layer thickness of 20 nm or less; and
   in the step (iv), the first semiconductor layer is selectively thermally decomposed by heating at a temperature condition of 1000 to 1200° C. in the hydrogen atmosphere containing ammonia having a molar flow ratio of 1% or less to remove the first semiconductor layer and expose the second semiconductor layer.

6. A method for producing a field effect transistor, the method comprising:
   crystal-growing a first semiconductor layer comprising GaN on a first substrate;
   crystal-growing a second semiconductor layer on the first semiconductor layer, the second semiconductor layer comprising a nitride semiconductor containing Al and having a higher thermal decomposition temperature than GaN;
   crystal-growing a channel layer comprising a nitride semiconductor on the second semiconductor layer;
   crystal-growing a barrier layer on the channel layer, the barrier layer comprising a nitride semiconductor having bandgap energy larger than that of the channel layer in a first axis direction;
   crystal-growing a third semiconductor layer on the barrier layer, the third semiconductor layer comprising a nitride semiconductor formed by crystal growth in the first axis direction;
   bonding a second substrate to the third semiconductor layer;
   removing the first substrate and creating a state in which the barrier layer, the channel layer, the second semiconductor layer, and the first semiconductor layer are formed in this order on the second substrate;
   after removing the first substrate, selectively thermally decomposing the first semiconductor layer to remove the first semiconductor layer and expose the second semiconductor layer; and
   after removing the first semiconductor layer:
      forming a source electrode on the second semiconductor layer and in ohmic connection with the channel layer and a drain electrode on the second semiconductor layer and in ohmic connection with the channel layer; and
      forming a gate electrode between the source electrode and the drain electrode.

7. The method according to claim 6, wherein the second substrate comprises SiC, Si, or sapphire.

8. The method according to claim 6, wherein selectively thermally decomposing the first semiconductor layer comprises heating in a hydrogen atmosphere containing ammonia.

9. The method according to claim 6, wherein:
   the first semiconductor layer has a layer thickness of 200 nm or more;
   the channel layer comprises GaN;
   the barrier layer comprises AlN or AlGaN;

the third semiconductor layer comprises GaN and has a layer thickness of 100 nm or more; and the first semiconductor layer is formed in contact with the first substrate, the second semiconductor layer is formed in contact with the first semiconductor layer, the channel layer is formed in contact with the second semiconductor layer, the barrier layer is formed in contact with the channel layer, and the third semiconductor layer is formed in contact with the barrier layer.

10. The method according to claim 6, wherein:

the second semiconductor layer comprises Al having a composition of 20% or less and has a layer thickness of 20 nm or less; and selectively thermally decomposing the first semiconductor layer comprises heating at a temperature condition of 1000 to 1200° C. in a hydrogen atmosphere containing ammonia having a molar flow ratio of 1% or less to remove the first semiconductor layer and expose the second semiconductor layer.

* * * * *